United States Patent
En et al.

[19]

[11] Patent Number: 6,121,663
[45] Date of Patent: *Sep. 19, 2000

[54] LOCAL INTERCONNECTS FOR IMPROVED ALIGNMENT TOLERANCE AND SIZE REDUCTION

[75] Inventors: William G. En, Sunnyvale; Darin A. Chan, Campbell; David K. Foote; Fei Wang, both of San Jose; Minh Van Ngo, Union City, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/992,952

[22] Filed: Dec. 18, 1997

Related U.S. Application Data

[63] Continuation-in-part of application No. 08/861,897, May 22, 1997.

[51] Int. Cl.[7] .......................... H01L 29/76; H01L 29/94; H01L 31/062; H01L 31/113
[52] U.S. Cl. .......................... 257/377; 257/382; 257/383; 257/411; 257/760
[58] Field of Search ................................. 257/755, 760, 257/382, 763, 764, 383, 377, 411

[56] References Cited

U.S. PATENT DOCUMENTS

| | | |
|---|---|---|
| 5,294,295 | 3/1994 | Gabriel . |
| 5,332,924 | 7/1994 | Kobayashi ............................. 257/760 |
| 5,340,774 | 8/1994 | Yen . |
| 5,480,814 | 1/1996 | Wuu et al. . |
| 5,541,455 | 7/1996 | Hodges ................................. 257/768 |
| 5,624,874 | 4/1997 | Lim et al. . |
| 5,625,217 | 4/1997 | Chau et al. ............................ 257/412 |
| 5,635,426 | 6/1997 | Hayashi et al. . |
| 5,668,065 | 9/1997 | Lin . |
| 5,671,175 | 9/1997 | Liu et al. .............................. 257/296 |
| 5,677,249 | 10/1997 | Fukui et al. . |
| 5,677,557 | 10/1997 | Wuu et al. ............................. 257/382 |
| 5,683,922 | 11/1997 | Jeng et al. . |
| 5,763,923 | 6/1998 | Hu et al. ............................... 257/382 |
| 5,814,862 | 9/1998 | Sung et al. ............................ 257/382 |
| 5,852,310 | 12/1998 | Kadosh et al. ......................... 257/67 |

OTHER PUBLICATIONS

Stanley Wolf Ph.D., "Silicon Processing for the VLSI Era", vol. 3: The Submicron MOSFET, Lattice Press, pp. 648–661.

*Primary Examiner*—Mahshid Saadat
*Assistant Examiner*—Jesse A. Fenty

[57] ABSTRACT

At least one patterned dielectric layer is provided within a transistor arrangement to prevent a local interconnect from electrically contacting the gate conductor due to misalignments during the damascene formation of etched openings used in forming local interconnects. By selectively etching through a plurality of dielectric layers during the local interconnect etching process, the patterned dielectric layer is left in place to prevent short-circuiting of the gate to an adjacent local interconnect that is slightly misaligned.

10 Claims, 6 Drawing Sheets

LOCAL INTERCONNECTS FOR IMPROVED ALIGNMENT TOLERANCE AND SIZE REDUCTION

RELATED APPLICATIONS

This application is a continuation-in-part of U.S. patent Ser. No. 08/861,897 filed May 22, 1997.

TECHNICAL FIELD

The present invention relates to semiconductor devices and manufacturing processes, and more particularly to methods and arrangements for forming and insulating local interconnects within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a relatively low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or trench that connects the selected regions together. The use of local interconnects reduces the coupling burden on the subsequently formed higher layers to provide such connectivity, which reduces the overall circuit size and as such tends to increase the circuit's performance. Accordingly, as the densities of the circuits increase there is a continuing need for more efficient, effective and precise processes for forming smaller local interconnects.

One critical factor in the fabrication of local interconnects is the alignment of the local interconnect with respect to other regions or areas of the semiconductor device(s). It is important to keep the local interconnect electrically isolated from those regions or areas that are not to be electrically connected via the local interconnect. For example, if a local interconnect is to be provided only to a drain region of a transistor arrangement, the local interconnect should be aligned such that the local interconnect does not electrically contact the transistor's gate conductor and/or source region. Controlling the alignment of the local interconnects during damascene formation can be challenging and the difficulty in doing so is increased as the critical dimensions of the device shrinks. Given the very small areas and regions in sub-quarter micron devices, the tolerance for proper alignment of the local interconnecting trenches or vias (i.e., etched openings) is extremely small. If a local interconnect is misaligned and accidentally contacts another area or region, then the device may fail to operate as required.

Thus, there is a continuing need for improved methods and arrangements for forming local interconnects, and in particular to prevent the local interconnects from electrically contacting the wrong areas or regions due to misalignment.

SUMMARY OF THE INVENTION

The present invention provides improved methods and arrangements for forming local interconnects, and in particular that provide an additional insulating layer within the semiconductor device arrangement that prevents the local interconnect from electrically contacting the gate conductor due to alignment errors.

The above stated needs are met by a semiconductor device arrangement, in accordance with one aspect of the present invention, which includes a substrate, a gate arrangement, an insulating layer and at least one local interconnect. In accordance with one embodiment of the present invention, the substrate includes a source region and a drain region each of which are formed within an active region area. The gate arrangement is formed on the substrate and extends over the active region area and above and between the source and drain regions. The gate arrangement includes a gate conductor having an exposed top surface. The insulating layer covers at least a portion of the gate arrangement that is located above the active region area and at least a portion of the exposed top surface of the gate conductor. The local interconnect is formed above the active region area and electrically contacts a contact portion of the substrate within the active region area. In this unique arrangement, the local interconnect is electrically isolated from the gate conductor by the insulating layer. Thus, for example, a misaligned local interconnect is electrically insulated from the gate arrangement by the insulating layer.

The above stated needs are also met by a method for forming a local interconnect in a semiconductor device, in accordance with yet another aspect of the present invention. In one embodiment of the present invention, the method includes forming a gate conductor on a substrate, depositing a first dielectric layer over at least a first area of the gate conductor, and depositing a second dielectric layer over at least a portion of the first dielectric layer. The first and second dielectric layers are preferably made of different materials. The method includes selectively patterning the first and second dielectric layers by removing a portion of the second dielectric layer to expose a portion of the underlying first dielectric layer, and removing the exposed portions of the first dielectric layer such that the remaining patterned portions of the first and second dielectric layers are covering at least a portion of the first area of the gate conductor. The method includes depositing a third dielectric layer over the remaining patterned portion of the second dielectric layer and at least a portion of the substrate, and forming a fourth dielectric layer over the third dielectric layer. The third and fourth dielectric layers are preferably made of different materials. The method further includes forming at least one etched opening by selectively removing a portion of the fourth dielectric layer to expose a portion of the underlying third dielectric layer, and removing a portion of the third dielectric layer to expose a portion of the underlying substrate. As a result, the etched opening can be filled with at least one conductive material, such that the gate conductor and the conductive material are electrically isolated by at least a portion of the first dielectric layer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like referenced numerals refer to similar elements in which;

FIG. 1b depicts a cross-section of a typical semiconductor wafer having a semiconductor device arrangement as in FIG. 1a;

FIG. 2b depicts a cross-section of a portion of a typical semiconductor wafer having a semiconductor device arrangement as in FIG. 2a;

FIG. 4b depicts a cross-section of a portion of a semiconductor wafer, in accordance with one embodiment of the present invention, having an improved semiconductor device arrangement as in FIG. 4a;

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the important features of the present invention.

Figure 1A:
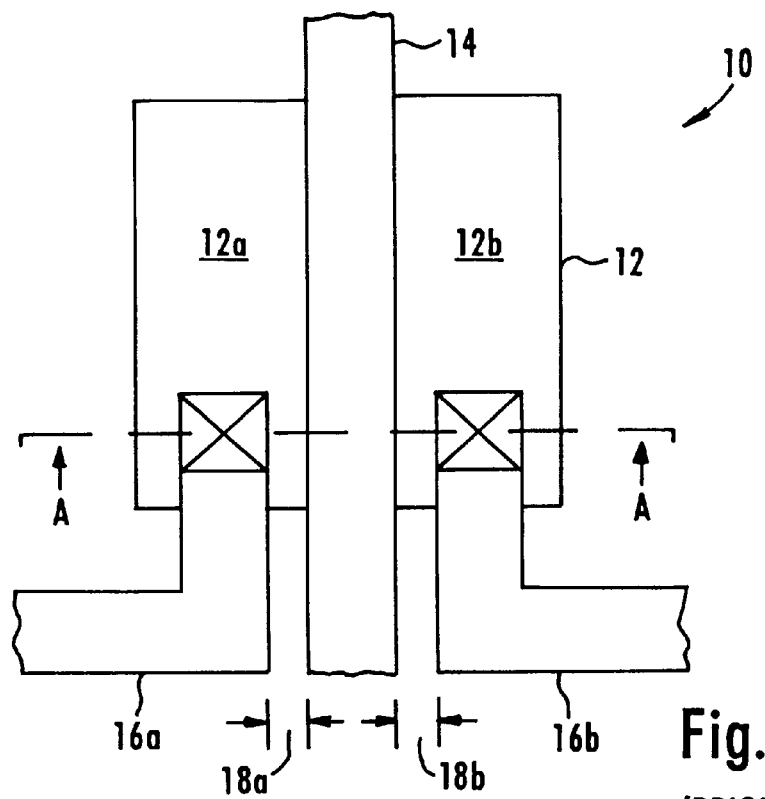
FIG. 1a is an elevational view of conventional semiconductor device arrangement having a gate conductor and local interconnect properly aligned with respect to one another.

With this in mind, the limitations of the prior art methods and arrangements will first be described as depicted in FIGS. 1a–b and 2a–b. FIG. 1a depicts a typical transistor arrangement 10 having an active region 12, a gate conductor 14, and local interconnects 16a and 16b. Within active region 12, there is a source region 12a and a drain region 12b that have been formed within a substrate 20 (see FIG. 1b). Substrate 20 is typically a doped silicon. The formation of active region 12 and source and drain regions 12a and 12b are well known to those skilled in the art, and for example typically include implantation of ions, such as phosphorous and boron ions, to dope substrate 20 accordingly. Gate conductor 14, which is typically a doped polycrystalline silicon (referred to hereafter as polysilicon), is depicted as crossing over active region 12. Local interconnects 16a and 16b have been formed to provide electrical connectivity to source 12a and drain 12b, respectively. As shown, local interconnect 16a and 16b are properly aligned such that gate conductor 14 is not in electrical contact with either local interconnect 16a or 16b. Gate conductor 14 is electrically isolated from local interconnect 16a by spacing 18a. Similarly, gate conductor 14 is electrically isolated from local interconnect 16b by spacing 18b. Thus, the transistor arrangement 10 of FIG. 1a will not malfunction due to short-circuiting caused by local interconnects 16a and 16b.

Figure 2A:
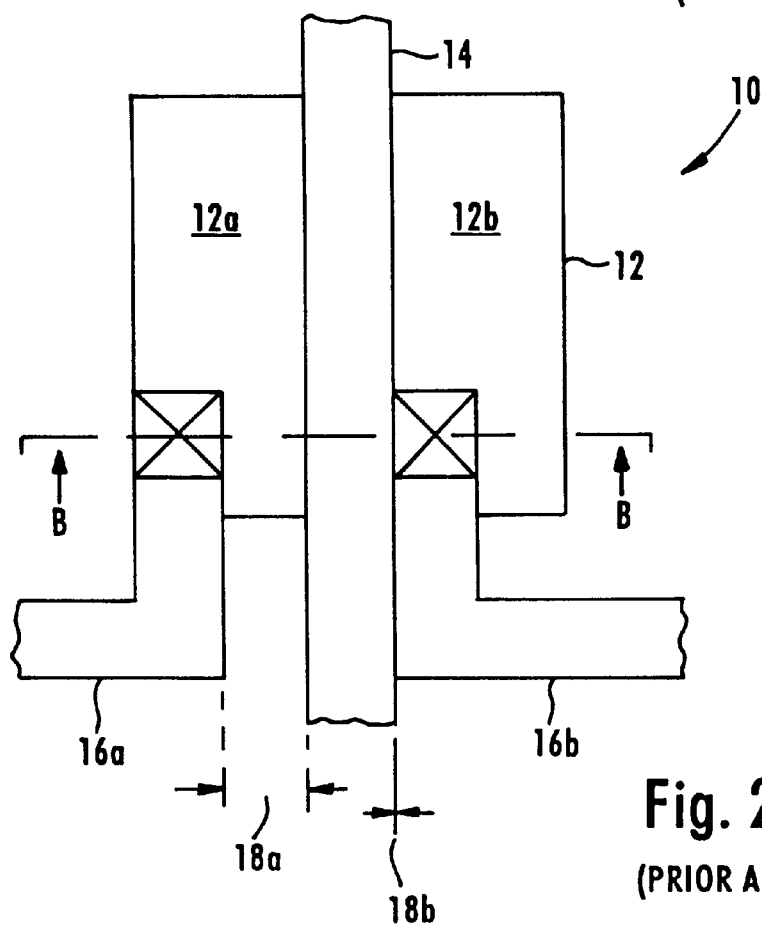
FIG. 2a is an elevational view of a conventional semiconductor device arrangement having a gate conductor and local interconnects which are misaligned with respect to one another.

To the contrary, FIG. 2a depicts a transistor arrangement 10 which is similar to transistor arrangement 10 in FIG. 1a, with the exception that local interconnects 16a and 16b are misaligned with respect to gate conductor 14. As shown, local interconnect 16b is electrically contacting gate conductor 14, as represented by spacing 18b which is essentially non-existent. Likewise, local interconnect 16a is also misaligned, but not electrically contacting gate conductor 14. Spacing 18a represents an increase in spacing between local interconnect 16a and gate conductor 14. Process errors such as mask misalignment and other factors can result in the local interconnect process forming misaligned local interconnects such as local interconnects 16a and 16b as depicted in FIG. 2a. Thus, transistor arrangement 10 in FIG. 2a is likely to malfunction due to the short-circuit caused by local interconnect 16b.

Figure 1B:
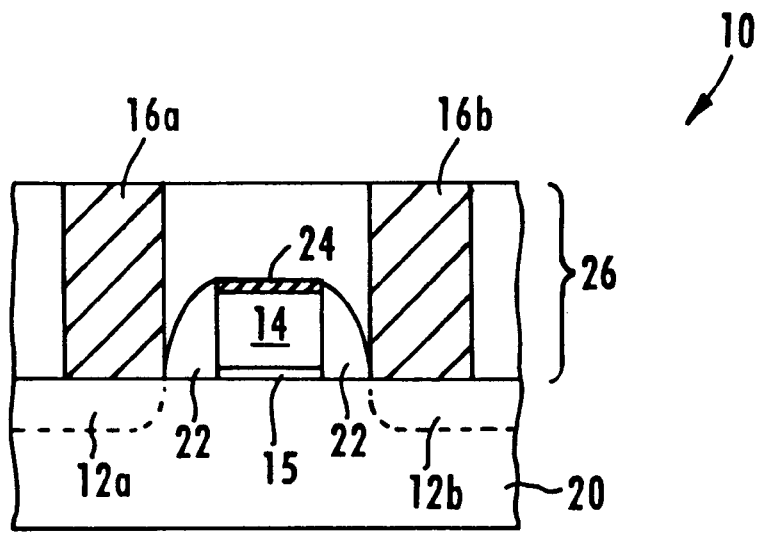

FIG. 1b depicts a cross-section of the transistor arrangement 10 of FIG. 1a (as viewed at perspective line A). The portion of the semiconductor wafer in FIG. 1b includes a substrate 20 in which source and drain regions 12a and 12b, respectively, have been formed. On top of substrate 20, gate conductor 14 (including silicon dioxide layer 15) and spacers 22 have been formed. Spacers 22 are typically a dielectric material and are used during the formation of source and drain regions 12a and 12b. As shown, gate conductor 14 further includes a silicide 24 that has been formed on top of gate conductor 14 to improve electrical conductivity. A dielectric layer 26 has been formed on the exposed portions of substrate 20, spacers 22 and gate conductor 14. Portions of dielectric layer 26 have been removed, for example, etched away using an etching tool, and local interconnects 16a and 16b have been formed in the openings. As shown, local interconnect 16a extends through dielectric layer 26 and is in electrical contact with a portion of source region 12a. Local interconnect 16b extends through dielectric layer 26 and is in electrical contact with a portion of drain region 12b. Local interconnects 16a and 16b typically include one or more conducting metals, such as, for example, titanium/titanium nitride and/or tungsten.

The alignment of local interconnect 16a and 16b with source region 12a and drain region 12b, respectively, is such that gate conductor 14 is electrically isolated from local interconnects 16a–b by the dielectric material in spacers 22 and/or portions of dielectric layer 26. Thus, the transistor arrangement in FIG. 1b, as fabricated, will function as designed, provided, of course, with the proper voltages and if source and drain regions 12a–b were properly formed.

Figure 2B:
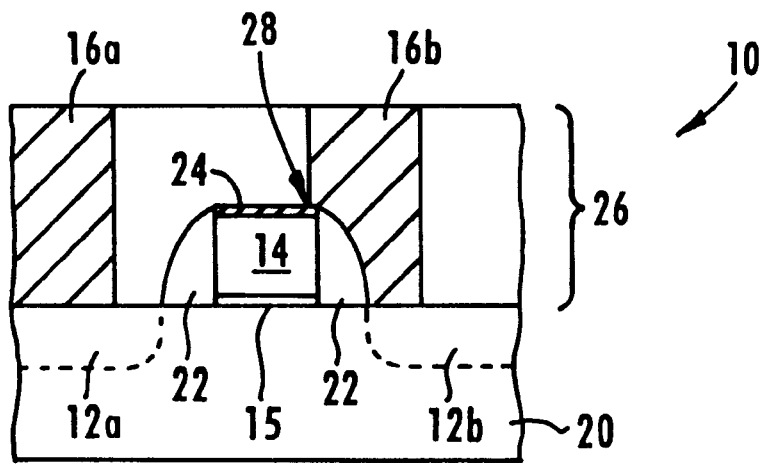

This is not the case in the cross-section depicted in FIG. 2b. This cross-section of the semiconductor wafer in FIG. 2b is of the transistor arrangement 10 in FIG. 2a (as viewed from perspective B). As shown in FIG. 2b, the misalignment of local interconnects 16a and 16b, with respect to gate conductor 14 causes an electrical contact area 28 between gate conductor 14 and local interconnect 16b. As a result of electrical contact area 28, local interconnect 16b and gate 14 are short-circuited and the transistor arrangement will not function properly.

Figure 3A:
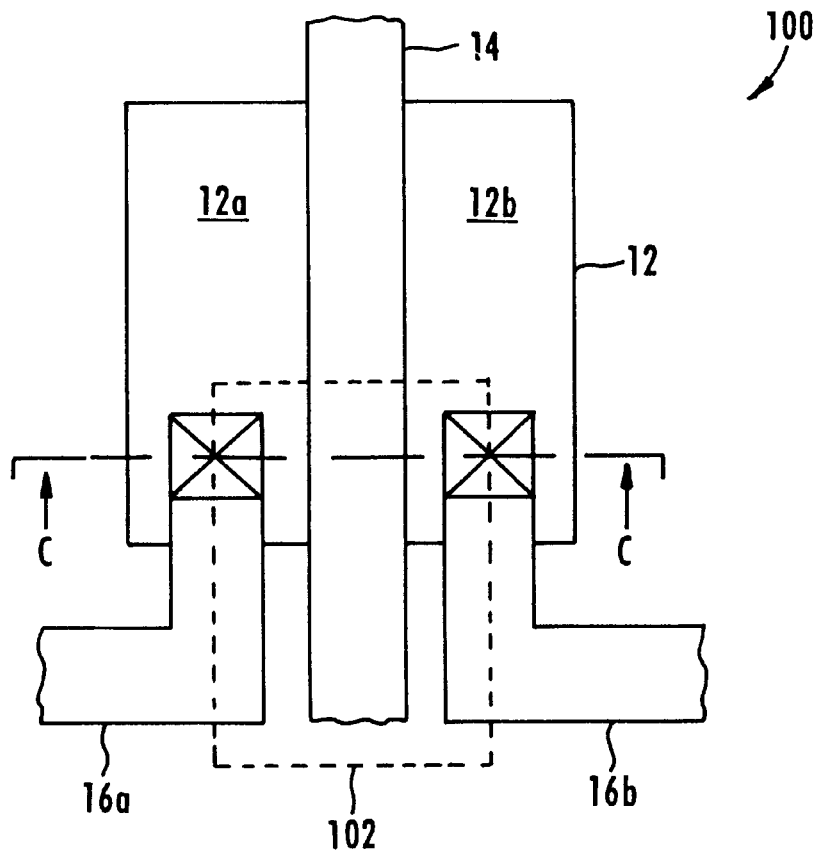
FIG. 3a is an elevational view of an improved semiconductor device arrangement having a gate conductor and local interconnects separated by an insulating layer, in accordance with one embodiment of the present invention.
Figure 3B:
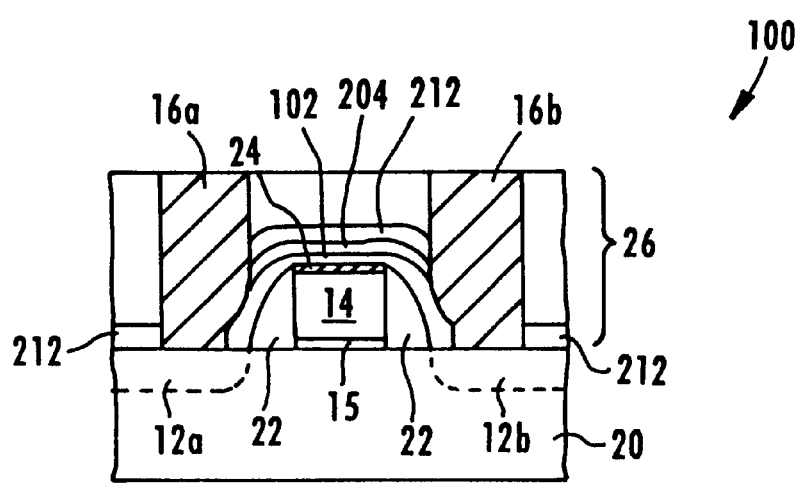
FIG. 3b depicts a cross-section of a portion of a semiconductor wafer having an improved semiconductor device arrangement as in FIG. 3a, in accordance with one embodiment of the present invention.

FIG. 3a depicts a top view of an improved semiconductor device arrangement 100 having an insulating layer 102 that further electrically isolates local interconnects 16a and 16b from gate conductor 14, in accordance with one embodiment of the present invention. FIG. 3b depicts a cross-section of a semiconductor wafer having an improved semiconductor device arrangement 100 (as viewed from perspective C). As shown in the cross-section in FIG. 3b, insulating layer 102 electrically isolates gate conductor 14 and silicide 24 formed thereon from local interconnects 16a and 16b. This additional electrical isolation reduces the chances of forming an electrical contact such as electrical contact area 28 in FIG. 2b due to misalignment of the local interconnects 16a–b with respect to gate conductor 14.

Figure 4A:
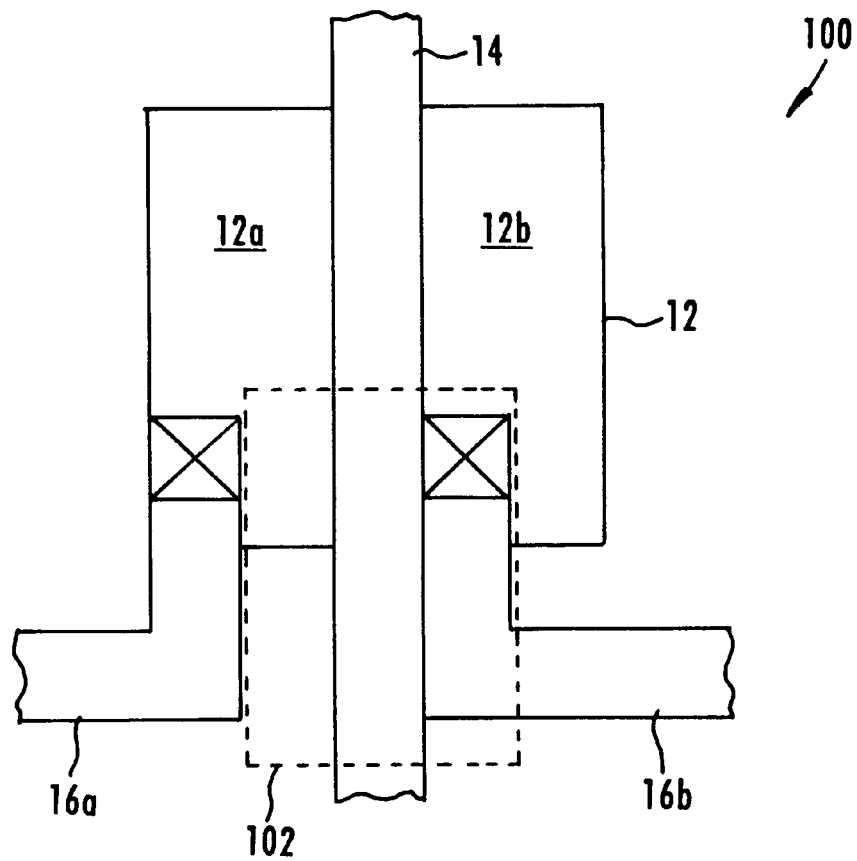
FIG. 4a depicts an improved semiconductor device arrangement having a gate conductor and local interconnects which are misaligned with respect to one another but separated by an insulating layer, in accordance with one embodiment of the present invention.
Figure 4B:
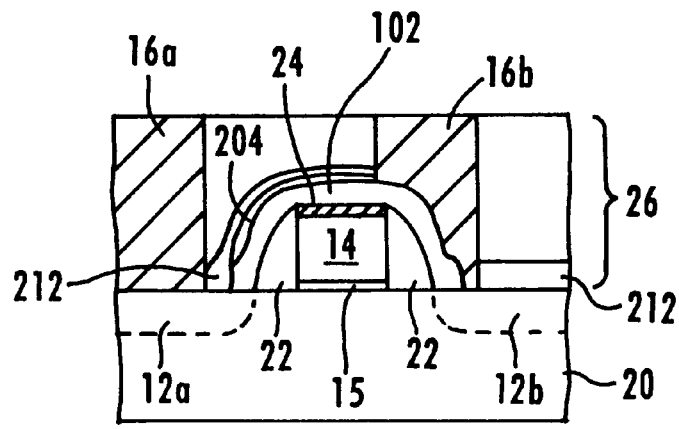

FIGS. 4a and 4b depict an improved semiconductor device arrangement 100, but where the local interconnects 16a and 16b are misaligned with respect to gate conductor 14. As shown in the elevation view of FIG. 4a, local interconnect 16b appears to be in electrical contact with gate conductor 14 due to the misalignment. This would be similar to the prior art arrangement depicted in FIG. 2a and 2b. However, as depicted in the cross-section of FIG. 4b, local interconnect 16b, although misaligned with respect to gate conductor 14, is separated (electrically and physically) from gate conductor 14 by the insulating layer 102. Thus, although misalignment occurred during fabrication in this example, the improved semiconductor device arrangement 100 depicted in FIGS. 4a and 4b will function properly (provided the misalignment did not result in a degradation of the electrical contacts between the local interconnects and the underlying active regions).

Figure 5A:
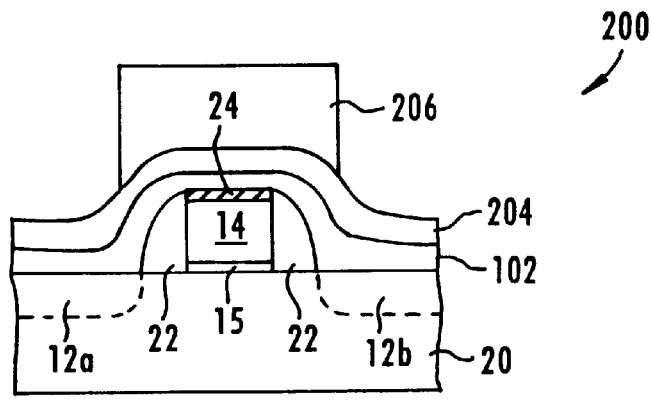
FIGS. 5a through 5e depict, sequentially, a cross-section of a semiconductor wafer during formation the insulating layer, as in FIGS. 3a–b and 4a–b, in accordance with one embodiment of the present invention.

FIGS. 5a–5e depict, sequentially, the formation of insulating layer 102, in accordance with certain embodiments of the present invention. In FIG. 5a, a portion 200 of a semiconductor wafer is shown (in cross-section view). Portion 200 includes a substrate 20, which is in accordance with one embodiment of the present invention a doped silicone. Within substrate 20, a source region 12a and a drain region 12b have been formed, for example, using conventional ion implantation techniques. Gate conductor 14 has been formed on a thin silicone dioxide ($SiO_2$) layer 15 located between gate conductor 14 and substrate 20. Silicide 24, such as titanium silicide, has been formed on top of gate conductor 14, in accordance with certain embodiments of the present invention, to improve electrical conductivity of conductive gate 14. Conductive gate 14, in accordance with a preferred embodiment to the present invention is a doped polysilicon material. Along the sidewalls of gate conductor 14, spacers 22 have been formed. Spacers 22 in accordance with one embodiment of the present invention are a dielectric material such as, for example, a silicon dioxide or similarly formed oxide material, or a silicon nitride or similarly formed nitride material. Next, a conformal insulating layer 102 has been formed over the exposed surfaces of substrate 20, spacers 22 and gate conductor 14. Insulating layer 102 is preferably a dielectric material such as, for example, a silicon dioxide or similarly formed oxide layer. A conformal stop layer 204 has been formed over insulating layer 102. For example, in certain embodiments, stop layer 204 is a silicon nitride film. Stop layer 204 is preferably a dielectric material that is different than insulating layer 102 such that etching techniques can be used to selectively etch stop layer 204 while stopping on insulating layer 102. A first resist mask 206 has been formed on stop layer 204. For example, first resist mask 206 can be formed by applying a photo resist material over stop layer 204 and developing/patterning the photo resist layer to leave first resist mask 206 in place.

Figure 5B:
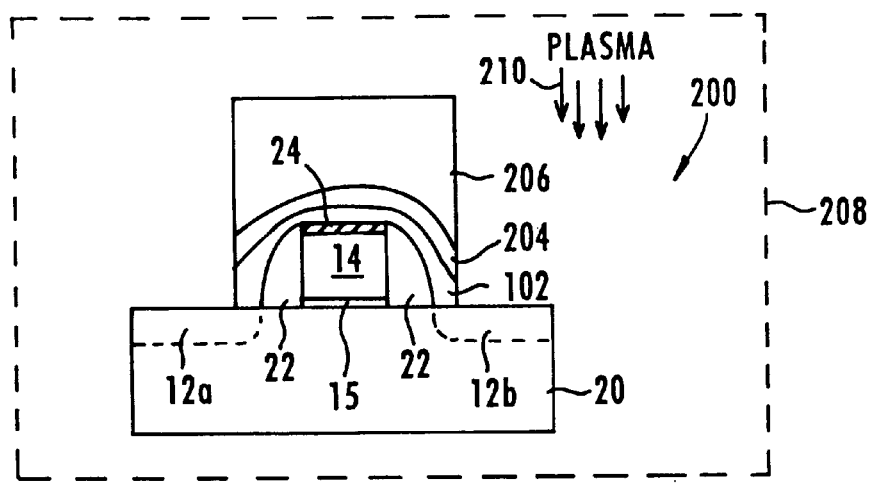

In FIG. 5b, the portion 200 in FIG. 5a has been placed in an etching tool 208 and etched using plasma 210. Etching tool 208 is a conventional plasma etching tool such as those available from Applied Materials, Inc., of Santa Clara, Calif. As depicted, plasma 210 has anisotropically etched away the exposed portions of stop layer 204 and the underlying portions of insulating layer 102. By way of example, if stop layer 204 is a silicon nitride layer, plasma 210 includes a chemistry that selectively etches stop layer 204 while stopping on insulating layer 102. Plasma 210 is then configured to etch away the remaining portions of insulating layer 102 that are exposed while stopping on substrate 20. Next, first resist mask 206 is removed using either chemical etching or stripping techniques.

Figure 5C:
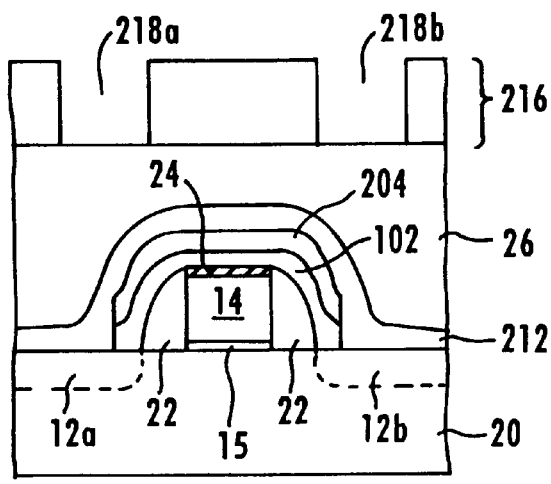

The portion 200 in FIG. 5c represents another important process in the development of the local interconnect formation for the portion in FIG. 5b. As shown in FIG. 5c, a first dielectric layer 212 has been formed over the exposed portions of substrate 20, insulating layer 102, and stop layer 204. First dielectric layer 212 serves as a stop layer that is used along with dielectric layer 26 during the formation of the local interconnects 16a and 16b. As such, first dielectric layer 212 is preferably a thin film of silicon nitride or a similarly formed nitride material that can be selectively etched when compared to dielectric layer 26 which is preferably a silicon dioxide or similarly formed oxide material, such as tetra ethylorthosilicate (TEOS) oxide. Dielectric layer 26 is deposited over first dielectric layer 212 and planarized, for example, using conventional chemical vapor deposition (CVD) techniques and chemical-mechanical polish (CMP) techniques, respectively. On top of dielectric layer 26 there is formed a local interconnect resist mask 216 which is patterned in a conventional manner to provide etching windows 281a and 218b.

Figure 5D:
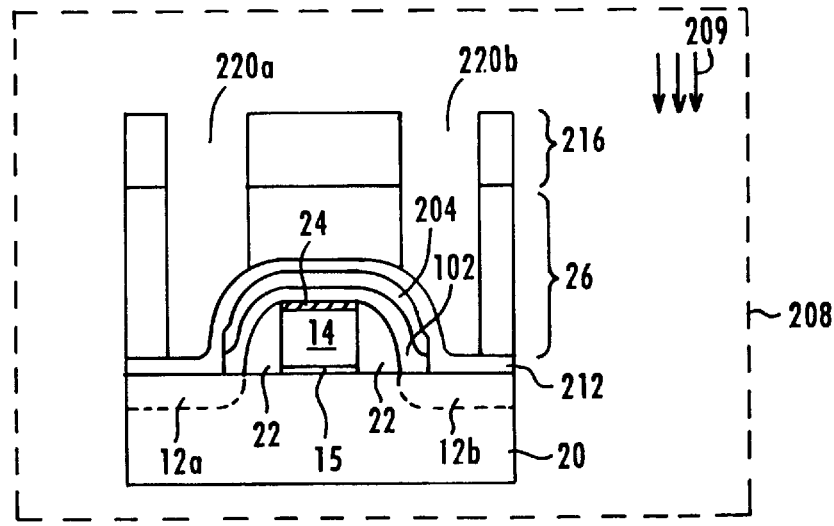
Figure 5E:
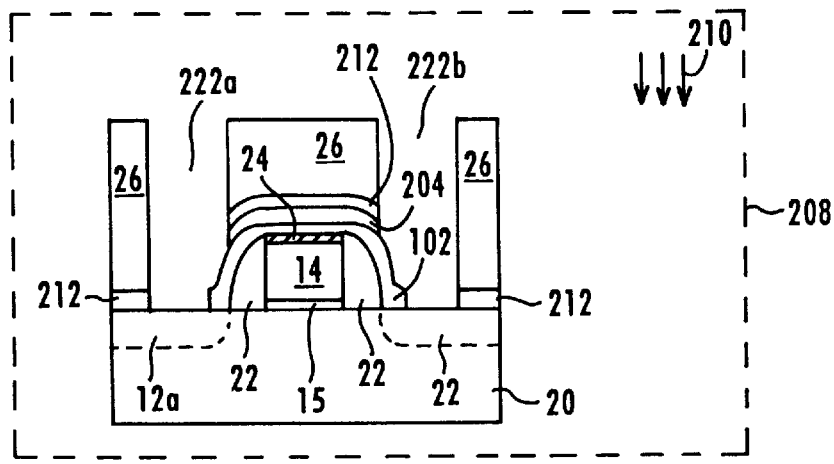

In FIG. 5d, the portion 200 depicted in FIG. 5c is placed within an etching tool 208 and subjected to plasma 209 that is configured to anisotropically etch through the portions of dielectric layer 26 exposed through the etching windows 218a and 218b of FIG. 5c. For example, if dielectric layer 26 is TEOS oxide then octaflourobutene ($C_4F_8$) based plasmas can be used to etch through dielectric layer 26. The result of the etching is an initial etched opening 220a and 220b. The etching of dielectric layer 26 stops on first dielectric layer 212. Next, as depicted in FIG. 5e, the portion 210 is further etched in etching tool 208 using plasma 210 (e.g., a $CF_3$ based plasma) that is configured to selectively etch through the exposed portions of first dielectric layer 212 within initial etched openings 220a and 220b. The result of this second etching process is the formation of final etched openings 222a and 222b. Final etched opening 222a extends through dielectric layer 26 and first dielectric layer 212 leaving source region 12a partially exposed. Similarly, final etched opening 222b extends through dielectric layer 26 and second dielectric layer 212 to leave portions of drain region 12b exposed. Due to a preferably high selectivity of the plasma 210 between first dielectric layer 212 and insulating layer 102 (provided by $F_3$ based plasma, for example), the exposed portions of insulating layer 102 that come in contact with plasma layer 210 are left significantly intact.

Figure 6:
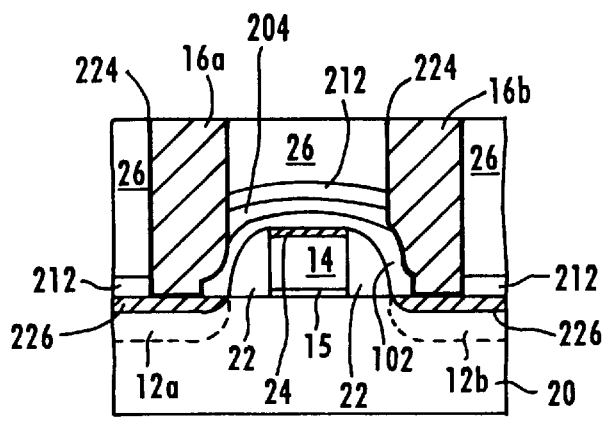
FIG. 6 depicts a cross-section of a portion of a semiconductor wafer having an improved semiarrangement with an insulating layer separating the gate conductor and local interconnects, in accordance with one embodiment of the present invention.

FIG. 6 illustrates a completed local interconnect formation in which the final etched openings 222a and 222b have been filled with electrically conductive materials. For example, as depicted, local interconnect 16a and 16b have been formed within final etched openings 222a and 222b, respectively, by first applying a glue layer 224 such as titanium/titanium nitride, followed by a plug formed of tungsten (W). Local interconnect 16a and 16b, therefore, extend through dielectric layer 26 and first dielectric layer 212 to provide electrical contact to the underlying source region 12a and drain region 12b, respectively within substrate 20. In accordance with certain embodiments of the present invention, the active regions, such as source region 12a and drain region 12b, further include silicide regions 226. As in known in the art, silicide regions 226 further increase the electrical characteristics and conductivity of source and drain regions 12a and 12b.

The methods and arrangements of the present invention advantageously take advantage of conventional fabrication processes including, for example, implantation, deposition, etching, and/or CMP processes. The methods and arrangements in accordance with the present invention are fully adaptable to different semiconductor devices having different materials and/or critical dimensions.

By way of example only, in accordance with certain embodiments of the present invention, substrate 20 is silicon that is approximately 2 mm thick and on which there is grown a lightly doped epitaxial layer that is approximately 4 $\mu$m thick. Thin oxide layer 15 is silicon dioxide and is grown on silicon 20 using conventional techniques to a thickness of approximately 55 Å. Gate conductor 14 is patterned from a deposited layer of doped polysilicon and is approximately 1,700 Å thick. Silicide 24 and 226 are titanium-silicide formed on gate conductor 14 and on portions of source and drain regions 12a and 12b to a thickness of approximately 700 Å, using a known processes. Source and drain regions 12a and 12b preferably include lightly doped regions (e.g., lightly doped drain (LDD)) which are formed by ion implantation using the gate conductor and spacers 22 for patterning/alignment and phosphorous and boron dopants, respectively. Insulating layer 102 is a conformal dielectric layer, such as a thin film of silicon dioxide or similarly formed oxide material that is approximately 500 Å thick, and more preferably between approximately 200 Å and 1000 Å thick. First stop layer 204 is a conformal dielectric layer, such as a thin film of silicon nitride that is approximately 350 Å thick. Second stop layer 212 is also a conformal dielectric layer, such as a thin film of silicon nitride that is approximately 800 Å thick. Dielectric layer 26 is preferably a layer of oxide, such as, for example TEOS oxide, approximately 6,500 to 9,500 Å thick following CMP processing.

Although the present invention tends to add some steps to the fabrication process, the additional electrical isolation provided by insulating layer 102 allows minor local interconnect misalignment problems to occur during manufacture. By reducing failures due to misalignment of the gate conductor (or other similar conductive lines) and one or more local interconnects, the methods and arrangements of the present invention should increase the yield of the manufacturing process. This is especially true for manufacturing semiconductor devices having critical dimensions less than a quarter of a micron (0.25 $\mu$m), as provided by the present invention.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A semiconductor device arrangement comprising:

a substrate having a source region and a drain region formed within an active region area;

a gate arrangement formed on the substrate and extending over the active region area and above and between the source and drain regions, the gate arrangement including a gate conductor having an exposed top surface;

an insulating layer covering at least a portion of the gate arrangement that is located above the active region area and covering at least a portion of the exposed top surface of the gate conductor and directly overlying a portion of the source region and a portion of the drain region;

a first stop layer directly overlying the insulating layer and covering at least a portion of the gate arrangement;

a second stop layer directly overlying the first stop layer and covering at least a portion of the gate arrangement, wherein the second stop layer is of a substantially similar material to that of the first stop layer but of a substantially different material from that of the insulating layer; and at least one local interconnect formed above the active region area and electrically contacting a contact portion of the substrate within the active region area, and wherein the local interconnect is electrically isolated from at least one of the source, the drain and the gate conductor by the insulating layer.

2. The semiconductor device arrangement as recited in claim 1, wherein the gate arrangement further includes at least one dielectric spacer that is formed on the substrate and is in physical contact with the gate conductor and the insulating layer.

3. The semiconductor device arrangement as recited in claim 1, wherein the gate arrangement further includes a silicon dioxide layer between the gate conductor and the substrate.

4. The semiconductor device arrangement as recited in claim 1, wherein the gate conductor comprises polysilicon.

5. The semiconductor device arrangement as recited in claim 4, wherein the gate conductor further comprises a silicide formed on the polysilicon.

6. The semiconductor device arrangement as recited in claim 1, further comprising a patterned dielectric on the second stop layer, wherein the patterned dielectric forms at least one etched opening that extends through the patterned dielectric and is filled with at least one conductive material that electrically contact the contact portion of the substrate within the active region area.

7. The semiconductor device arrangement as recited in claim 1, wherein the first stop layer and the second stop layer each include at least one dielectric layer selected from the set of silicon dioxide layer, an oxide layer, a silicon nitride layer, and a nitride layer.

8. The semiconductor device arrangement as recited in claim 6, wherein the conductive material comprises tungsten.

9. The semiconductor device arrangement as recited in claim 1, wherein the insulating layer comprises oxide.

10. The semiconductor device as recited in claim 1, wherein the device has a critical dimension of less than 0.25 $\mu$m.

* * * * *